May 3, 1966 D. P. SANTE 3,249,880

TEMPERATURE STABILIZED SEMICONDUCTOR DETECTOR

Filed May 29, 1961

INVENTOR.
DANIEL P. SANTE

BY Spencer E. Olson

ATTORNEY

United States Patent Office 3,249,880

Patented May 3, 1966

3,249,880

TEMPERATURE STABILIZED SEMICONDUCTOR DETECTOR

Daniel P. Sante, Williamsville, N.Y., assignor to Sylvania Electric Products Inc., a corporation of Delaware Filed May 29, 1961, Ser. No. 113,425

11 Claims. (Cl. 329—101)

This invention relates generally to semiconductor circuits and more particularly to a semiconductor diode detector circuit having good detection efficiency and stability over a substantial range of operating temperatures.

A detector is a circuit in which an asymmetrical conducting device is used to remove the carrier frequency from a modulated carrier, usually referred to as the RF signal, and retaining the modulating frequencies. A simple and common form of detector is the amplitude modulation diode detector shown in FIG. 1, which consists of a tuned input coupling circuit, series diode 1, load resistor 2, and capacitor 3. Since the amplitude of the RF signal varies at the rate of the modulating signal, the modulating signal portion of the RF envelope is developed across capacitor 3. The diode detection efficiency, which is defined as the ratio of the D.C. voltage across load resistor 2 to the peak RF signal voltage $$\eta=\frac{E_{d.c.}}{\sqrt{2}E_{rms}}$$

becomes higher as the value of resistor 2 is increased. For efficient linear detection, load resistor 2 should be several times larger than the forward resistance of the diode 1. However, load resistor 2 can be increased only to the point where capacitor 3 can discharge rapidly enough to follow changes in the RF signal produced by modulation. Hence, the bandwidth of the detected signal is determined by the RC time constant of the circuit. The upper frequency where the detected signal response falls to 0.707 of the mid-frequency response is given by:

$$f=\frac{1}{2\pi RC}$$

The minimum sensitivity of a diode detector is determined by the volt-ampere characteristic of the diode, representative conduction curves of typical germanium and silicon semiconductor diodes being shown in FIG. 2. Since the unbiased diode in the basic detector has its initial operating point at the origin of FIG. 2, it must use part of the input signal to drive it to the knee of the curve. The knee represents the start of effective forward conduction in the diode. The knee may also be described as the start of the active region of the volt-ampere characteristic curve. This means that the basic detector is not very sensitive to small signals as it cannot detect signals which fall below the knee of the curve. The amount of driving voltage needed depends upon the type of diode used. According to the typical diode curves in FIG. 2, 0.3 volt is required for germanium and 0.6 volt is required for silicon. Because germanium requires less drive, basic detectors that employ germanium diodes are inherently more sensitive to the smaller signals. However, although more sensitive, germanium has the disadvantage of being limited to operating temperatures below 85° C. Silicon diodes, therefore, are more desirable in detectors that must be operable over a wide temperature range.

Consequently, in the design of detectors, provision is usually made for applying a voltage or current bias to the diode, so that the input signal need not be used to drive it to the forward conduction region. For example, by adding a potentiometer 5 to the basic diode circuit of FIG. 1, as shown in FIG. 3, the initial operating point can be shifted from the origin to the knee of the volt-ampere curve. With the circuit so biased, detection is more effective as practically all of the input signal operates on the active portion of the curve and consequently is detected. Also in the prior art circuit of FIG. 3, a transistor emitter-follower 6 is used to buffer the detector from succeeding circuitry to maintain a low level of distortion. In this circuit, the resistor R provides a D.C. return for the base of the transistor, and the coupling capacitor C couples the alternating current signal developed across capacitor 3 to the base of the transistor to prevent the transistor from D.C.-loading the detector circuitry. Although the conventional voltage biasing circuit of FIG. 3 does much to improve detector sensitivity, this circuit has certain limitations. The characteristic curve of any semiconductor diode is known to shift with temperature, the shift, as indicated in FIG. 4, tending to be predominantly along the abscissa—to the left with increasing temperature and to the right with decreasing temperature. A shift in the curve produces an attendant shift in the location of the bias point. For example, at room temperature 0.6 volt is required to bias the diode of FIG. 4 to the knee (point A) of its characteristic curve. With the potentiometer 5 adjusted to give this bias, an increase in ambient temperature, say to 100° C., shifts the operating point to point B because of decrease in diode resistance with increase in temperature. It will be seen that point B is far above the knee of the 100° C. curve. Thus, if the detector were required to operate in an environment where the temperature varied between 25° C. and 100° C., the operating point of the diode would continually shift between points A and B and cause severe changes in sensitivity at low signal levels. This condition of a shifting operating point might be further complicated by drift in the power supply voltage. The shifting problem could be solved by periodically adjusting the potentiometer 5 so as to maintain the operating point at the knee of the curve, but this situation has been found to be impractical and consequently most detectors employ current-instead of voltage-biasing, current sources capable of delivering substantially constant current over wide temperature range being available. FIG. 4 illustrates that a circuit which supplies a diode with up to 100 microamperes of bias current should stabilize the operating point of the diode to the knee of the curve regardless of the operating temperature.

The circuit of FIG. 3 can easily be converted to a typical current biased detector by making resistor 2 of sufficiently higher resistance than in the voltage-biased circuit to insure a relatively constant current in the diode circuit over a wide temperature range. That is, resistor 2 could be made large enough, compared to the resistance of semiconductor diode 1 that it essentially determines the amount of bias current that will flow regardless of changes in the diode resistance due to temperature changes. Increasing the resistance of resistor 2, however, requires that the voltage of battery B be increased to levels not normally used in transistor circuits, and causes the emitter-follower to load the detector somewhat.

Accordingly, it is a general object of this invention to provide an improved solid state diode detector.

It is a more particular object of this invention to provide a simplified detector circuit having high detection efficiency without deteriorating overall bandwidth.

Another object of this invention is to provide a solid state diode detector whose performance is substantially independent of temperature.

Another object of this invention is to provide a diode biasing circuit which automatically maintains the operating point of the diode in the knee region of its volt-ampere characteristic substantially independent of temperature.

A still further object of the present invention is to provide a simple diode detector, having the foregoing features, which additionally has a low output impedance so as to be compatible with other semi-conductor circuitry.

Briefly, the detector according to the invention comprises an input coupling circuit, a semiconductor diode, and a transistor emitter-follower circuit. The diode is series-connected directly to the base of the transistor, and is automatically forward-biased to the knee of its volt-ampere characteristic curve by contribution of the base-emitter current of the transistor, substantially independent of temperature. The capacitance required for detection action may be provided by the inherent capacitance of the transistor. Optimum diode loading is provided by proper choice of the emitter load resistor, and the emitter-follower provides a buffer between the detector and output circuit to maintain low distortion and prevent serious loading and the resultant deterioration of frequency response.

Other objects and advantages of the invention will become apparent from the following description, reference being had to the accompanying drawings, wherein.

Figure 5:
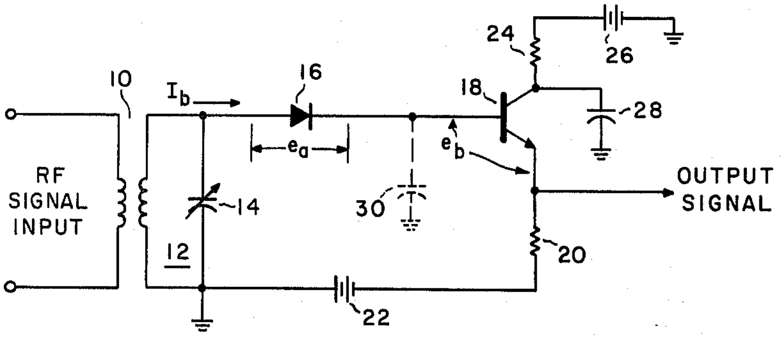
FIG. 5 is a schematic diagram of a diode detector circuit in accordance with the invention.

Referring to FIG. 5, in the diode detector circuit of the invention, the RF signal to be detected is inductively coupled by transformer 10 to a tunable input coupling circuit 12 which includes the secondary winding of the transformer and capacitor 14. Diode 16 is series-connected between one terminal of input circuit 12 to the base of transistor 18, illustrated as being of the NPN type, with the anode of the diode connected to the input circuit and its cathode connected to transistor 18. The emitter of transistor 18 is connected through a load resistor 20 to the negative terminal of bias voltage source 22, which may be a battery as illustrated. The positive terminal of the voltage source 22 is connected to ground potential as is the other terminal of input circuit 12. With these connections it will be seen that the circuit loop for the base-emitter current of transistor 18 consists of bias supply 22, input circuit 12, diode 16, the base-emitter junction of transistor 18, and resistor 20. The transistor is connected as an emitter-follower with the detected signal output taken from the emitter. The collector is coupled through a load resistor 24 to the positive terminal of another D.C. voltage source 26. A capacitor 28 is connected from the collector of the transistor to ground to by-pass any signal which appears on the collector.

Normally the internal capacitance of the transistor, shown in dotted lines at 30, is sufficient for satisfactory operation of the circuit; should the inherent capacitance be too low, a capacitor may be connected from the base of the transistor to ground. The base-emitter junction resistance and emitter load resistor are analogous to the diode load resistor 2 in FIG. 1. Transistor 18 may be of the germanium junction type for applications below 85° C. and is preferably of the silicon junction type for higher temperature applications. Diode 16 may be silicon or germanium, depending upon the anticipated ambient temperature, and preferably is of the junction type for large signal detection applications and of the point-contact type for very small signal and microwave detector applications.

Employing procedures well known to transistor circuit designers, resistors 20 and 24 and voltage sources 22 and 24 are designed to establish and maintain proper biasing conditions on transistor 18; that is, proper collector-to-emitter voltage and emitter current. It is generally possible to select these voltages so that proper operating characteristics are maintained despite variations in ambient temperature and variations of gain and leakage current between transistors of the same type. The collector-base leakage current, $I_{cbo}$, is, of course, a component of the base current of the transistor, $I_b$, but by proper selection of the transistor, this parameter will have a negligible effect on the base current insofar as the general operation of the present invention is concerned. Since resistor 20 predominantly establishes the effective detector load, its value, as previously described in connection with FIG. 1, can be increased only to the extent that it will not deteriorate the bandwidth of the detected signal. For the emitter-follower configuration shown in FIG. 5, the current flow in the base-emitter circuit loop maintains the base-emitter junction of transistor 18 forward biased, and, as will be explained further, this base-emitter current flow also automatically maintains the series-connected diode 16 forward-biased to the knee region of its volt-ampere characteristic.

Basic detector operation is improved by the simplified circuit structure of this invention in the following manner: The emitter-follower circuit configuration, as is well known in the art, presents a high input impedance to detector diode 16 and a low output impedance to the output circuitry. Hence, the emitter-follower acts to buffer the detector from output circuitry loading and A.C. shunting, and thereby minimizes or avoids this common source of deterioration of frequency response and distortion. Also, a low impedance output signal makes the circuit compatible with transistor circuit parameters and other low impedance devices.

The base current of the transistor is used to automatically maintain the quiescent operating point of detector diode 16 in the knee region of its volt-ampere characteristic essentially independent of temperature. As previously discussed, biasing in this manner optimizes detector sensitivity. To more fully explain the automatic biasing feature, operation of a circuit in which the diode and transistor are both of the silicon junction type will be considered. Referring to FIG. 5, $e_a$ represents the voltage drop across diode 16 at the knee of its volt-ampere characteristic curve and $e_b$ represents the voltage drop across the base-emitter junction of transistor 18 at the knee of its conduction curve. For a silicon P-N junction at 25° C., $e_a$ and $e_b$ are each typically about 0.6 volt D.C. In a typical circuit which has been satisfactorily operated resistor 20 was 10,000 ohms and bias supply 22 was −20 volts. Transistor base current, $I_b$, is $$I_b=\frac{I_e}{\beta+1}-I_{cbo}$$

where $I_e$ is emitter current, $I_{cbo}$ is collector leakage current, and $\beta$ is the forward current gain of the transistor.

In the illustrated circuit, $$I_e=\frac{E-(e_a+e_b)}{R_e}$$

where E is the potential of the bias voltage source 22 and $R_e$ is the resistance of load resistor 20.

Hence, $$I_b=\frac{E-(e_a+e_b)}{R_e(\beta+1)}-I_{cbo}$$

Assuming typical values of 50 for $(\beta+1)$ and 2 microamperes for $I_{cbo}$ at 25° C., $$I_b=\frac{-20+(1.2)}{10,000(50)}-2\times10^{-6}\approx35 \text{ microamperes}$$

It has been observed that $I_{cbo}$ varies logrithmically with temperature T according to the relationship $I_{cbo}=E^{-k}/T$ and, for high $\beta$ silicon transistors, typically varies from 2 to 20 microamperes over the temperature range of 25° C. to 100° C. Hence, assuming the circuit values of the above example, the transistor leakage current $I_{cbo}$ would change $I_b$ by only a small amount with a like temperature change—roughly, from 17 to 35 microamperes. The forward current gain, $\beta$, of a transistor, since it depends upon the construction, the manufacturer of the device, etc., may increase, remain relatively constant, or decrease with temperature. For all practical purposes $\beta$ may be considered as a constant over a wide temperature range, but even if it varied by a factor of two, $I_b$ would still remain well within 100 microamperes.

Figures 1, 2, 3, 4:
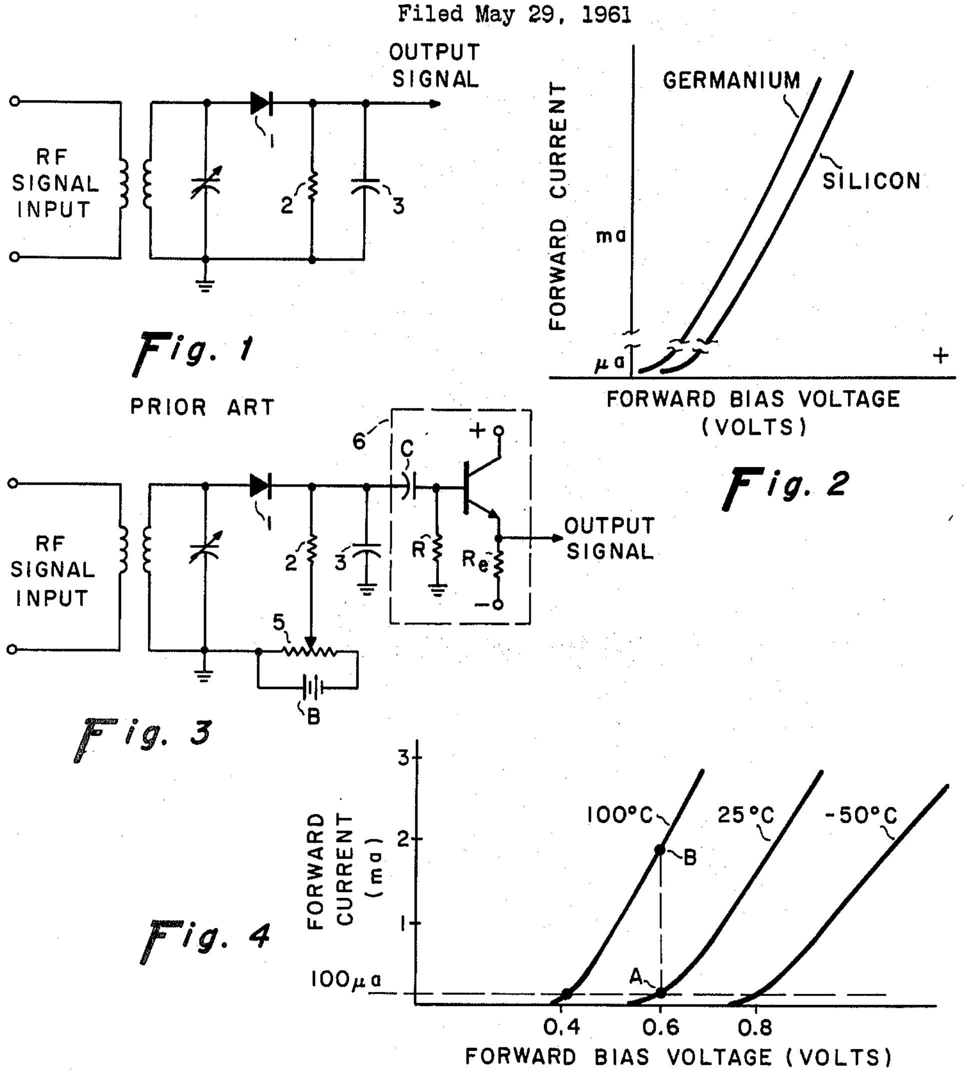
FIG. 1 (PRIOR ART), FIG. 2, FIG. 3, FIG. 4
FIG. 1 is a schematic diagram of a basic AM diode detector circuit to which previous reference has been made.
FIG. 2 shows typical volt-ampere characteristic curves for germanium and silicon semiconductor diodes.
FIG. 3 is a schematic diagram of another prior art AM diode detector circuit, also referred to earlier.
FIG. 4 shows typical volt-ampere characteristic curves for a semiconductor diode at various diode temperatures.

Reference to FIG. 4 shows that the resistance of a semiconductor junction, being directly proportional to voltage, varies inversely with temperature. Hence, the resistances of both the diode 16 and the transistor base-emitter junction will vary inversely with temperature. However, even if such a variation results in a ±0.2 volt change in both $e_a$ and $e_b$, the variation in $I_b$ in the above example would be insignificant (±1 or 2 microamperes). Consequently, a base current $I_b$ of less than 100 microamperes will be maintained to properly bias the transistor regardless of changes in $\beta$, $I_{cbo}$, $e_a$ and $e_b$ with temperature. This current flows through diode 16 since it is in series with the base-emitter junction of transistor 18. FIG. 4 shows that a current of less than 100 microamperes will easily maintain the quiescent operating point of diode 16 in the knee region of the characteristic curve regardless of temperature. Hence, diode 16 is automatically biased to the knee of its volt-ampere characteristic by the base current of transistor 18 independent of changes in operating temperature. This method of biasing assures optimum sensitivity, and thus contributes to high efficiency in most detector applications.

In the case of very low signal detection, where point-contact type diode detectors are usually employed, it may be desirable to maintain a nearly constant current bias over a wide temperature range. In this case, diode 16, transistor 18, and emitter load resistor 20 are so chosen that changes in emitter current, $I_e$, due to variations in $e_a$, $e_b$, $\beta$, and $I_{cbo}$ with temperature, compensate each other to maintain the following relationship:

$$\Delta I_b \approx \frac{\Delta I_1}{\Delta \beta} - \Delta I_{cbo} \approx 0$$

That is, the opposing influences operating to change the bias current $I_b$ can be made to essentially neutralize one another. The net result is the stabilization of diode bias current $I_b$ over the operating temperature range.

From the foregoing it is seen that an efficient, temperature-stable detector circuit has been provided which is very simple and inexpensive. In essence, the invention comprises the use of the base current of a transistor amplifier, employing D.C. emitter degeneration, to maintain the operating point of a diode detector, connected in the input circuit of the amplifier, in the vicinity of the knee of the diode detector volt-ampere characteristic curve essentially independent of temperature. In addition, the emitter-follower provides a buffer between the detector and its output circuit, and the internal capacitance of the transistor together with the emitter circuit resistance determines the time constant of the detector circuit. The result is an extremely simple detector circuit which maintains optimum sensitivity and loading without deteriorating overall bandwidth, and, hence, provides high detection efficiency and stable operation essentially independent of temperature.

Although the circuit of FIG. 5 has been described as using an NPN transistor, it is to be understood that a PNP transistor may be used with bias supplies 22 and 26 reversed and diode 16 reversed. Further, the signal output could be taken from the collector load resistor 24 instead of the emitter by connecting by-pass capacitor 28 from emitter to ground instead of from collector to ground.

While there has been disclosed what is at present considered to be a preferred embodiment of the invention, it is obvious that various modifications and changes may be made therein without departing from the intended scope of the invention as defined in the appended claims.

What is claimed is:

1. A detector circuit, comprising, a transistor having base, emitter and collector electrodes, a diode having its anode directly connected to the base electrode of said transistor, a source of direct current potential, a resistor connected between the emitter of said transistor and one terminal of said source of potential, and means for coupling an input signal to the cathode of said diode, the bias current for said diode being determined primarily by the resistance of the base-emitter junction of said transistor, the resistance of said diode, said resistor, and said potential, and the RC time constant of said detector circuit being determined primarily by the capacitance of said transistor and said resistor.

2. A detector circuit comprising, an input circuit having first and second terminals, a transistor having base, emitter, and collector electrodes, a diode connected between the first terminal of said input circuit and the base of said transistor, a first source of direct current potential, a first resistor connected between the collector electrode of said transistor and said first source of potential, a capacitor connected between the collector electrode of said transistor and a source of reference potential, a second source of direct current potential, and a second resistor connected between the emitter electrode of said transistor and said second source of potential, the bias current for said diode being primarily determined by the base-emitter impedence of said transistor, said second resistor, and said second source of potential, and the time constant of said detector circuit being primarily determined by the inherent capacitance of said transistor and said second resistor.

3. A detector circuit comprising, a semiconductor diode having anode and cathode electrodes, a transistor having base, collector and emitter electrodes connected as an emitter-follower and including a load resistor connected at one end to said emitter, a source of direct current potential having first and second terminals of opposite polarity, an input circuit having two terminals respectively connected to one of the electrodes of said diode and to one of the terminals of said source of potential, a direct connection from the other electrode of said diode to the base of said transistor, and a direct connection from the other end of said load resistor to the other terminal of said source of potential, said diode being poled relative to said source of potential to produce a forward biasing current through said diode, said load resistor and said transistor constituting the load for said diode.

4. A solid state detector having substantially constant sensitivity independent of temperature comprising, a semiconductor diode having anode and cathode electrodes and whose conduction characteristic shifts with variations in temperature, a transistor having base, emitter and collector electrodes connected as an emitter follower and including a load resistor connected at one end to said emitter, a source of direct current potential having terminals of opposite polarity, an input circuit having one terminal connected to one of the electrodes of said diode and a second terminal connected to one of the terminals of said source of potential, a direct connection from the other electrode of said diode to the base of said transistor, and a direct connection from the other end of said resistor to the other terminal of said source of potential, said diode being poled relative to said source of potential to cause a biasing current to flow in the forward direction through said diode, said source of potential and said load resistor having values related to the forward resistance of said diode and to the resistance of the base-emitter junction of said transistor to cause said current to have a value to bias said diode to the region of the knee of its conduction characteristic substantially independently of variations with temperature of the resistances of said diode and said base-emitter junction.

5. A detector circuit comprising, a transistor having base, emitter and collector electrodes, a diode having anode and cathode electrodes, a direct connection between the cathode of said diode and the base of said transistor, a source of direct current potential having positive and negative terminals, a resistor connected between the emitter of said transistor and the negative terminal of said source, an input circuit having first and second terminals, and means respectively connecting said first and second terminals to the anode of said diode and to the positive terminal of said source, means for supplying a signal to be detected to said input circuit, and an output terminal connected to the emitter of said transistor at which an output signal is derived.

6. A solid state detector circuit having substantially constant sensitivity independent of temperature comprising, a semiconductor diode whose conduction characteristic shifts with changes in temperature, a two terminal input circuit having its first terminal connected to the anode of said diode, a source of direct current potential having positive and negative terminals, a connection between the positive terminal of said source and the second terminal of said input circuit, a transistor having base, collector and emitter electrodes connected as an emitter-follower and including a load resistor connected between said emitter and the negative terminal of said source of potential, and a direct connection between the cathode of said diode and the base electrode of said transistor, said source of potential and said load resistor having values related to the resistances of said diode and to the resistance of the base-emitter junction of said transistor to cause a current which biases said diode to the region of the knee of its conduction characteristic to flow in the series path including said diode, the base-emitter junction of said transistor, said load resistor, said source of potential and said input circuit substantially independently of variations with temperature of the resistances of said diode and said base-emitter junction, and the beta of said transistor.

7. A detector circuit according to claim 6 wherein said transistor is of the NPN type.

8. A detector according to claim 7 further including an output terminal connected to the emitter of said transistor, and wherein the internal capacitance of said transistor together with said load resistor primarily determines the time constant of the detector circuit.

9. A semiconductor detector circuit comprising, a semiconductor diode whose conduction characteristic shifts with changes in temperature, a two-terminal input circuit having its first terminal connected to the anode of said diode, means for supplying an input signal to said input circuit, a source of direct current potential having positive and negative terminals, means connecting the positive terminal of said source to the second terminal of said input circuit, a transistor having base, collector and emitter electrodes connected as an emitter-follower and including a load resistor connected between said emitter and the negative terminal of said source of potential, a direct connection between the cathode of said diode and the base electrode of said transistor whereby the base-emitter junction of said transistor is in the series conduction path with said load resistor, said input circuit and said diode in the order named, said source of potential and said load resistor having values related to the resistance of said diode and the resistance of the base-emitter junction of said transistor to cause the flow of current in said semiconductor path to bias said diode to the region of the knee of its conduction characteristic, the leakage current between the collector and base electrodes of said transistor, which also varies with temperature, also flowing in said conduction path to compensate for the tendency of said biasing current to vary with temperature thereby to maintain said diode biased to the region of the knee of its conduction characteristic.

10. In a circuit including a semiconductor diode having anode and cathode electrodes and whose conduction characteristic shifts with variations in temperature, a circuit for biasing said diode to the knee of its conductor characterstic substantially independently of temperature comprising, a transistor having at least base, emitter, and collector electrodes connected as an amplifier, a source of direct current potential having terminals of opposite polarity, means connecting one terminal of said source of potential to one electrode of said diode, a direct connection from the other electrode of said diode to the base of said transistor, and a resistor connected between one of the other electrodes of said transistor and the other terminal of said source of potential, said diode being poled relative to said source of potential to cause a biasing current to flow in the forward direction through said diode.

11. In a wide-range amplitude detector, the combination comprising: a first semiconductor element having a forward operating range wherein its resistance is relatively high below a characteristic threshold voltage level thereacross and is relatively low above said threshold level, a second semiconductor element, a direct current source, said first and said second elements having similar voltage-versus-current characteristics; a current limiting impedance and means connecting said second element and said impedance in series across said direct current source for establishing a forward bias voltage across said second element, means coupled to said first element and responsive to an amplitude-modulated carrier signal for producing a flow of current through said elements, and means coupled to said first element and responsive to said flow of current for deriving a direct current signal which varies as a function of the amplitude modulations on said carrier signal.

References Cited by the Examiner

UNITED STATES PATENTS

| | | | |
|---|---|---|---|
| 2,662,976 | 12/1953 | Pankove | 329—101 |
| 2,866,892 | 12/1958 | Barton | 329—101 |
| 2,996,680 | 8/1961 | Barry et al. | 329—102 |

FOREIGN PATENTS

| | | |
|---|---|---|
| 595,326 | 3/1960 | Canada. |

OTHER REFERENCES

Electronic Design, 4–55, Saunders, "Designing Reliable Transistor Circuits-II," pp. 36–39 (see Fig. 5 and page 36, col. 1).

ROY LAKE, *Primary Examiner.*

ROBERT H. ROSE, *Examiner.*